(12) United States Patent
Coronel et al.

(10) Patent No.: US 6,417,072 B2
(45) Date of Patent: Jul. 9, 2002

(54) METHOD OF FORMING STI OXIDE REGIONS AND ALIGNMENT MARKS IN A SEMICONDUCTOR STRUCTURE WITH ONE MASKING STEP

(75) Inventors: Philippe Coronel, Massy; Renzo Maccagnan, Villabe; Philippe Lacombe, Paris, all of (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/779,388

(22) Filed: Feb. 8, 2001

(30) Foreign Application Priority Data

Feb. 10, 2000 (EP) ............................................. 00480020

(51) Int. Cl.[7] ....................... H01L 21/76; H01L 21/311; H01L 21/302; H01L 21/461; H01L 21/31
(52) U.S. Cl. ...................... 438/424; 438/700; 438/734; 438/778
(58) Field of Search ................................ 438/418, 221, 438/218, 296, 400, 424, 435, 694, 700, 734, 778

(56) References Cited

U.S. PATENT DOCUMENTS

| | | | | |
|---|---|---|---|---|
| 5,893,744 A | * | 4/1999 | Wang | .......................... 438/401 |
| 5,943,590 A | * | 8/1999 | Wang et al. | ......... 148/DIG. 50 |
| 5,963,816 A | * | 10/1999 | Wang et al. | ................ 468/401 |
| 6,191,000 B1 | * | 2/2001 | Huang et al. | ............... 438/401 |
| 6,232,200 B1 | * | 5/2001 | Chu | .......................... 438/401 |
| 6,303,458 B1 | * | 10/2001 | Zhang et al. | ............... 438/401 |

* cited by examiner

Primary Examiner—Richard Elms
Assistant Examiner—Adam Pyonin
(74) Attorney, Agent, or Firm—Tiffany L. Townsend

(57) ABSTRACT

The method of the present invention applies to any semiconductor structure provided with polysilicon filled deep trenches formed in a silicon substrate coated by a Si3N4 pad layer both in the "array" and "kerf" areas. First, a photoresist mask is formed onto the structure and patterned to expose the deep trenches only in the "array" areas. Deep trenches are then anisotropically dry etched to create recesses having a determined depth. Next, the photoresist mask is removed only in the "array" areas. A step of anisotropic dry etching is now performed to extend said recesses down to the desired depth to create the shallow isolation trenches. The photoresist mask is totally removed. A layer of oxide (STI oxide) is conformally deposited by LPCVD onto the structure to fill said shallow isolation trenches in excess. The structure is planarized to create the STI oxide regions and expose deep trenches in the "kerf" areas. The polysilicon in these deep trenches is partially or totally removed by etching. Finally, the Si3N4 pad layer is eliminated, creating recesses that will be used as alignment marks for the subsequent photolithography steps. If the polysilicon is not etched, the above method will produce polysilicon bumps instead that can be used for the same purpose.

11 Claims, 9 Drawing Sheets

METHOD OF FORMING STI OXIDE REGIONS AND ALIGNMENT MARKS IN A SEMICONDUCTOR STRUCTURE WITH ONE MASKING STEP

FIELD OF INVENTION

The present invention relates to the manufacture of semiconductor integrated circuits and more particularly to a method of forming the STI oxide regions and alignment marks in a semiconductor structure provided with polysilicon filled deep trenches with only one masking step. STI (Shallow Trench Isolation) oxide regions are used to isolate devices from each other in the substrate and alignments marks are used in photolithography steps for reticle registration. The method finds extensive application in the field of DRAM (Dynamic Random Access Memory) and EDRAM (Embedded DRAM) chips where polysilicon filled deep and shallow trenches are formed in the semiconductor substrate.

BACKGROUND OF THE INVENTION

In the manufacture of semiconductor integrated circuits and especially in DRAM/EDRAM chips having polysilicon filled deep and shallow trenches formed in a silicon substrate, a specific MUV photolithography mask is used to create the alignment marks in the silicon structure that are required for reticle registration during the subsequent photolithography steps. For instance, DRAM chips wherein the elementary storage cell is of the so-called "BEST" type are concerned by such a masking step. "BEST" cells are described in the IBM Journal of Research and Development, Vol. 39, No ½ January/March 1995, in an article entitled "The Evolution of IBM CMOS Technology by E. Adler et al, pp 167-185.

Basically, at the end of the Deep Trench (DT) module, capacitor deep trenches have been etched in the silicon substrate. Next, the so-called active areas (AAs) are formed using a first mask referred to as the AA mask. Active areas include the source/drain regions of all the Insulated Gate Field Effect Transistors (IGFETs). Then, shallow isolation trenches are formed and a layer of an oxide, referred to hereinbelow as the STI oxide, is deposited to conformally coat the wafer surface, in order to fill the shallow isolation trenches in excess. The STI oxide layer is then planarized, i.e. the oxide on top of the AAs is removed and the oxide in the shallow isolation trenches etched down to approximately the silicon substrate level to create the so-called STI oxide regions. The planarization step is generally performed by Chemical-Mechanical Planarization (CMP). At this stage of the fabrication process, the wafer surface is substantially planar. These steps which are carried out in the STI module aim to isolate AAs from each other by said STI oxide regions. Afterwards, well and surface implants are performed before the gate conductor (GC) stack is deposited. The delineation of the GC stack to define the IGFET gate conductors requires the deposition of a photoresist layer and a DUV mask. The implants require MUV masks to prevent some regions of the wafer from being implanted. In order to successfully register these masks (both MUV implant masks and DUV GC mask) with a good accuracy, it is necessary to create alignment marks at the wafer surface. To date, this is the role of an additional MUV mask, referred to as the KV mask, which is formed right after STI oxide region formation. The above conventional fabrication process to form the STI oxide regions and the alignment marks with two masking steps will be now described in more details in conjunction with FIGS. 1 and 2A–2I.

Turning to FIG. 1, there is shown the top view and a cross section taken along line aa thereof of a state-of-the-art semiconductor structure 10 which is part of the wafer at the end of the DT module, i.e. after polysilicon filled deep trenches have been formed. Basically, structure 10 consists of a silicon substrate 11 with a 140 nm thick $Si_3N_4$ pad layer 12 formed thereupon (the underlying $SiO_2$ pad layer is not taken into consideration for the sake of simplicity). The $Si_3N_4$ pad layer is deposited on blanket wafers before deep trench formation, it will be used later on as an etch stop layer for various etch and CMP steps. As apparent in FIG. 1, two types of deep trenches labeled 13A and 13B have been formed in silicon substrate 11. Trenches 13A are formed in the "array" areas where the elementary memory cells are fabricated. Each memory cell is comprised of an IGFET and its associated capacitor that is formed in a deep trench as standard. Trenches 13B are formed in the "support" and in the "kerf" areas where one can find addressing circuits, drivers, . . . and measurement/alignment structures respectively. Some trenches 13B in the "kerf" areas will be used later on in the fabrication process as alignment marks. Deep trenches 13A and 13B are filled with polysilicon material as standard. The bottom part of the polysilicon fill 14', referred to hereinbelow as POLY2 (POLY1 is not shown in FIG. 1), is isolated from the substrate by a collar oxide layer 15 and the top part 14" is referred to hereinbelow as POLY3.

Now, the exposed polysilicon material of POLY3 is etched below substrate 11 surface to create recesses 16A and 16B that are shown in FIG. 2A. These recesses and this etch step will be referred to hereinbelow as RECESS3 and RECESS3 etch step respectively. Typically, the depth of RECESS3 in the silicon substrate 11 is about 50 nm. Note that the polysilicon of POLY3 is arsenic (As) doped so that the out diffusion of As atoms into the silicon substrate 11 will subsequently form a strap making an electrical connection between one electrode of the capacitor and the source/drain region of the IGFETs. The strap is "buried" to avoid an electrical short between the capacitor and the passing word lines (WLs) that are the gate conductors of the IGFETs. The passing word lines will be defined later on in the wafer processing by the so-called GC mask of the DUV type.

A first masking step is now necessary to define the active areas (AAs). Turning to FIG. 2B, a 135 nm thick layer 17 of an anti-reflective coating (ARC) material is blanket deposited onto structure 10, followed by the deposition of a 625 nm thick layer 18 of a photoresist. Adequate materials are AR3 900 and M20G supplied by Shipley USA, Malborough, Mass., USA. The ARC material is not only used for its anti-reflective properties, but also as a planarizing medium. The photoresist layer 18 is baked, exposed, and developed as standard to leave a patterned layer, that will be referred to hereinbelow as the AA mask still bearing numeral 18.

After the AA mask 18 has been formed, the process continues with an adequate three-step anisotropic dry etch process, to remove the ARC, $Si_3N_4$, monocrystalline silicon of substrate 11, polysilicon of POLY3/POLY2 and the collar oxide in sequence with three different chemistries at locations that are not protected by the AA mask 18. This etch process is performed in the MxP chamber provided with an electrostatic chuck ESC S3 and a Vespel ring of an AME 5000, a tool sold by Applied Materials Inc, Santa Clara, Calif., USA.

Adequate operating conditions for each etch step are:

1. ARC Etching

| | |
|---|---|
| Cathode temp. | 20° C. |
| Wall temp. | 45° C. |
| Pressure | 45 mTorr |
| RF power | 700 W |
| Magnetic field | 15 G |
| CF4 flow | 100 sccm |
| He Backside press. | 26 Torr |
| Duration | Etch End Point Detection (EPD) |

2. Si3N4 Etching

| | |
|---|---|
| Cathode temp. | 20° C. |
| Wall temp. | 45° C. |
| Pressure | 80 mTorr |
| RF power | 600 W |
| Magnetic field | 15 G |
| CHF3 flow | 60 sccm |
| O2 flow | 10 sccm |
| He Backside press. | 8 Torr |
| Duration | EPD |

3. Monocrystalline Silicon/POLY3/Collar Oxide Etching

| | |
|---|---|
| Cathode temp. | 20° C. |
| Wall temp. | 45° C. |
| Pressure | 35 mTorr |
| RF power | 450 W |
| Magnetic field | 0 G |
| NF3 flow | 8 sccm |
| Ar flow | 100 sccm |
| He Backside press. | 8 Torr |
| Duration | 260 sec |

This sequence of etching steps referred to hereinbelow as the AA/STI etch step is used to create the shallow isolation trenches and the active areas in the silicon substrate 11. Shallow isolation trenches will be subsequently filled with the STI oxide to form STI oxide regions. At this stage of the fabrication process, the structure 10 is shown in FIG. 2C. As apparent in FIG. 2C, the shallow isolation trenches referenced 19A are etched to a deepness below the silicon substrate 11 surface measured by parameter D1 which is equal to 260 nm in the instant case.

Residual ARC and photoresist materials of layers 17 and 18 are then removed from the wafer surface, using a conventional strip process exposing shallow isolation trenches 19A and recesses 16B as shown in FIG. 2D. At the end of that step, active areas are delineated as apparent in the top view of FIG. 2D where they are referenced 20.

Then, a layer 21 of oxide, referred to as the STI oxide, is conformally deposited onto the structure 10 by LPCVD as standard to fill shallow isolation trenches 19A and recesses 16B. Structure 10 is then planarized typically by chemical-mechanical polishing (CMP). The aim of this CMP planarization step is to remove the STI oxide in excess on top of the Si3N4 pad layer 12 and leave the STI oxide substantially filling the shallow isolation trenches 19A and recesses 16B forming STI oxide regions 21A and 21B in the "array" and "kerf" areas respectively as illustrated in FIG. 2E. The thickness of STI oxide regions 21B is equal to about 150 nm. STI oxide regions 21A and 21B that result from that step, referred to hereinbelow as the STI fill/planarization step, will be subsequently used for device isolation and alignment mark definition respectively.

To that end, a second masking step is required. A layer 22 of photoresist is deposited on the wafer surface, then baked, exposed, and developed as standard to leave a patterned layer, that will be referred to hereinbelow as the KV mask still bearing numeral 22 as shown in FIG. 2F. The role of the KV mask 22 is to expose STI oxide regions 21B in the "kerf" areas to create the alignment marks.

After the KV mask 22 has been formed, the process continues with a wet etch step, that totally removes the STI oxide in STI oxide regions 21B defining thereby recesses in the silicon substrate 11 (with regards to the Si3N4 pad layer surface) located in the "kerf" areas that are referenced 23B in FIG. 2G.

Next, the residual photoresist material of layer 22 is removed from the wafer surface using a conventional strip process as illustrated in FIG. 2H.

Finally, the Si3N4 pad layer 12 is removed, leaving recesses 23B at desired locations of the silicon substrate 11 surface that will be used as alignment marks in the subsequent photolithography steps. The final structure 10 is shown in FIG. 2I. Alignment marks are essential in the fabrication process because they permit the correct registration of the mask reticles.

The above conventional method described by reference to FIGS. 2A–2I which requires two masking steps and which creates only recesses to be used as alignment marks is not satisfactory from a manufacturing point of view. The additional KV mask which is thus specifically required to create the alignment marks after STI oxide regions have been formed, must be designed for each semiconductor product. The KV masking step negatively affects both the cycle-time and tool capacity. Moreover, it consumes expensive photoresist materials and necessitates the fabrication of a specific reticle increasing thereby the overall manufacturing costs.

SUMMARY OF THE PRESENT INVENTION

It is therefore a primary object of the present invention to provide a method of forming the STI oxide regions and alignment marks in a semiconductor structure provided with deep trenches with only one masking step.

It is another object of the present invention to provide a method of forming the STI oxide regions and alignment marks in a semiconductor structure provided with deep trenches in DRAM/EDRAM chips which avoids the masking step usually referred to as the KV mask.

It is another object of the present invention to provide a method of forming the STI oxide regions and alignment marks in a semiconductor structure provided with deep trenches in DRAM/EDRAM chips which not only allows the formation of recesses but also of bumps whenever desired to be subsequently used as alignment marks.

It is still another object of the present invention to provide a method of forming the STI oxide regions and alignment marks in a semiconductor structure provided with deep trenches in DRAM/EDRAM chips which improves process cycle-time and tool capacity to reduce the overall manufacturing costs.

The accomplishment of these objects and other related objects is achieved by the improved method of the present invention which applies to any semiconductor structure provided with polysilicon filled deep trenches formed in a silicon substrate coated by a Si3N4 pad layer both in the "array" and "kerf" areas. First, a photoresist mask is formed onto the structure and patterned to expose the deep trenches only in the "array" areas. Deep trenches are then anisotropically dry etched to create recesses having a determined depth. Next, the photoresist mask is removed only in the "array" areas. A step of anisotropic dry etching is now performed to extend said recesses down to the desired depth to create the shallow isolation trenches. The photoresist mask is totally removed. A layer of oxide (STI oxide) is conformally deposited by LPCVD onto the structure to fill said shallow isolation trenches in excess. The structure is planarized to create the STI oxide regions and expose deep trenches in the "kerf" areas. The polysilicon in these deep trenches is partially or totally removed by etching. Finally, the Si3N4 pad layer is eliminated, creating recesses that will be used as alignment marks for the subsequent photolithography steps. If the polysilicon is not etched, the above method will produce polysilicon bumps instead that can be used for the same purpose.

The method of the present invention thus allows the simultaneous formation of the STI oxide regions and the alignment marks. An important aspect of the method of the present invention is to leave polysilicon (POLY3) in the deep trenches to create recesses to be subsequently used as alignment marks in the "kerf" areas, preventing them from being filled by the STI oxide and then to create recesses without using any mask by etching selectively to the STI oxide. This process also allows the formation of polysilicon (POLY3) bumps if so desired to be subsequently used as alignment marks.

The novel features believed to be characteristic of this invention are set forth in the appended claims. The invention itself, however, as well as these and other objects and advantages thereof, will be best understood by reference to the following detailed description of an illustrated preferred embodiment to be read in conjunction with the accompanying drawings.

DESCRIPTION OF A PREFERRED EMBODIMENT

Figure 1:
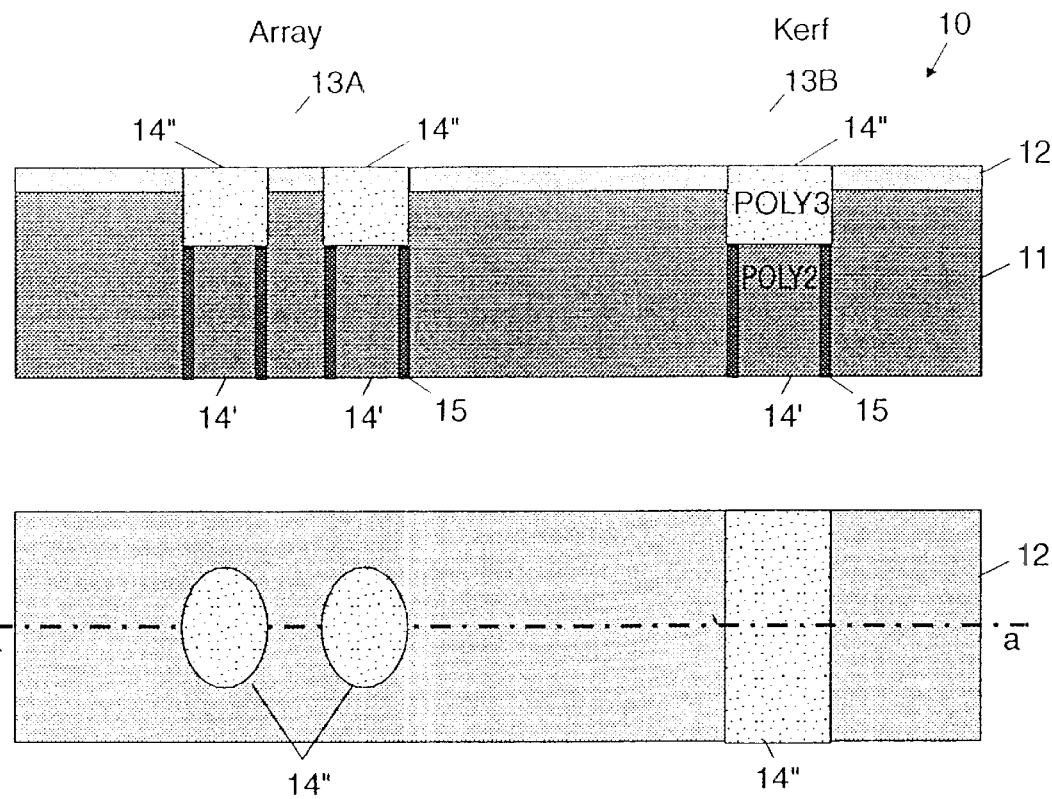
FIG. 1 schematically shows the top view and its cross-section along line aa of a state-of-the-art semiconductor structure after polysilicon filled deep trenches have been formed in the "array" and "kerf" areas of the silicon substrate.
Figure 2A:
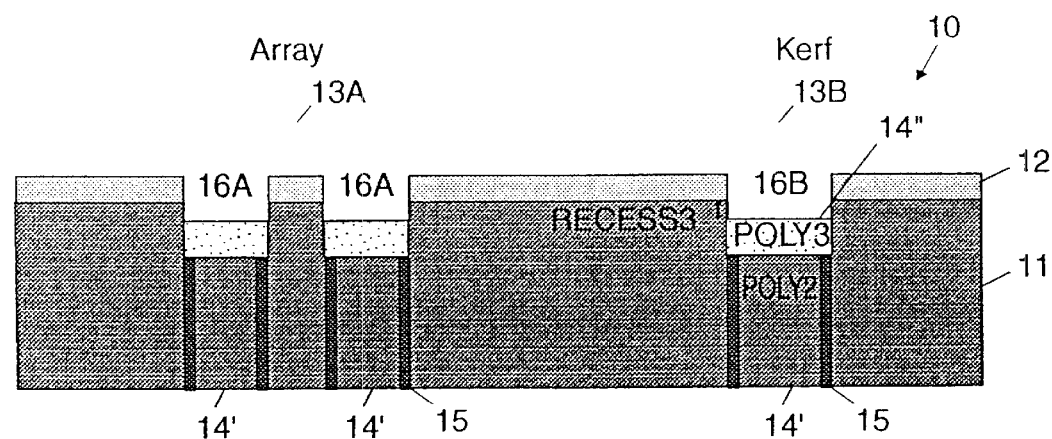
FIGS. 2A–2I show the structure of FIG. 1 undergoing the sequence of steps of a conventional process to form the STI oxide regions and then create alignment marks in the silicon substrate at the so-called KV mask level.
Figure 2A:
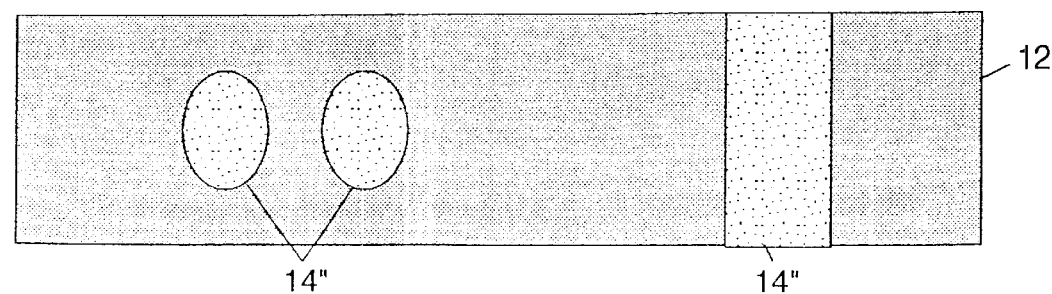
Figure 2B:
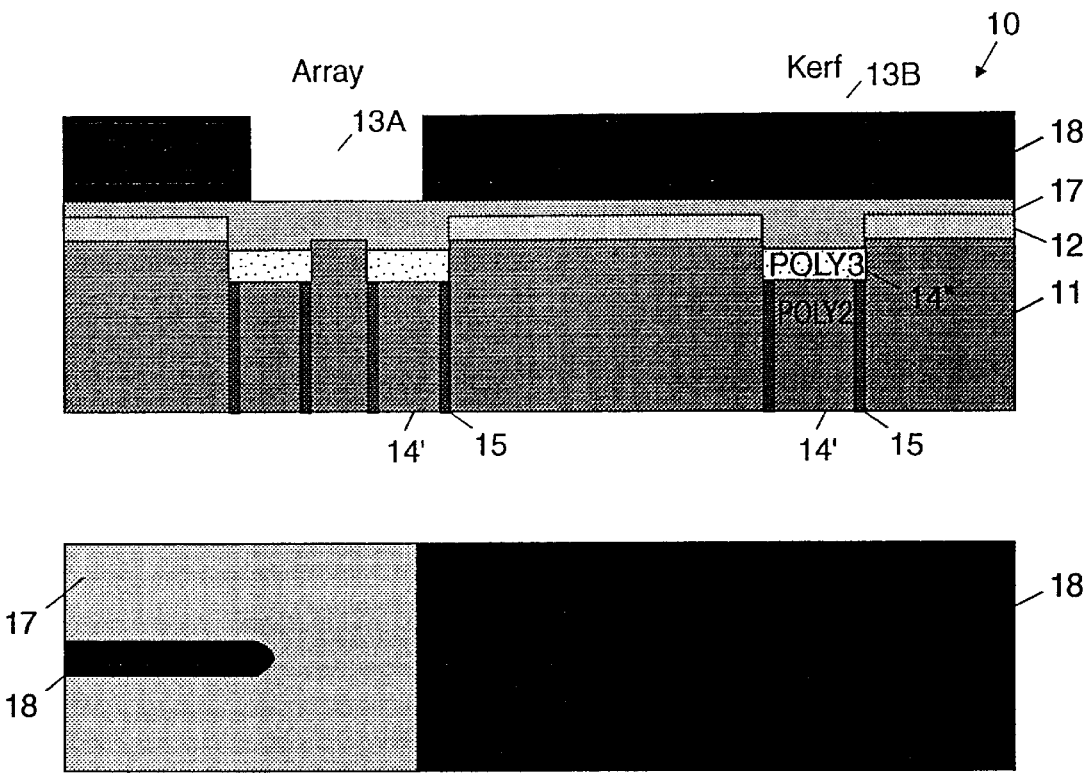
Figure 2C:
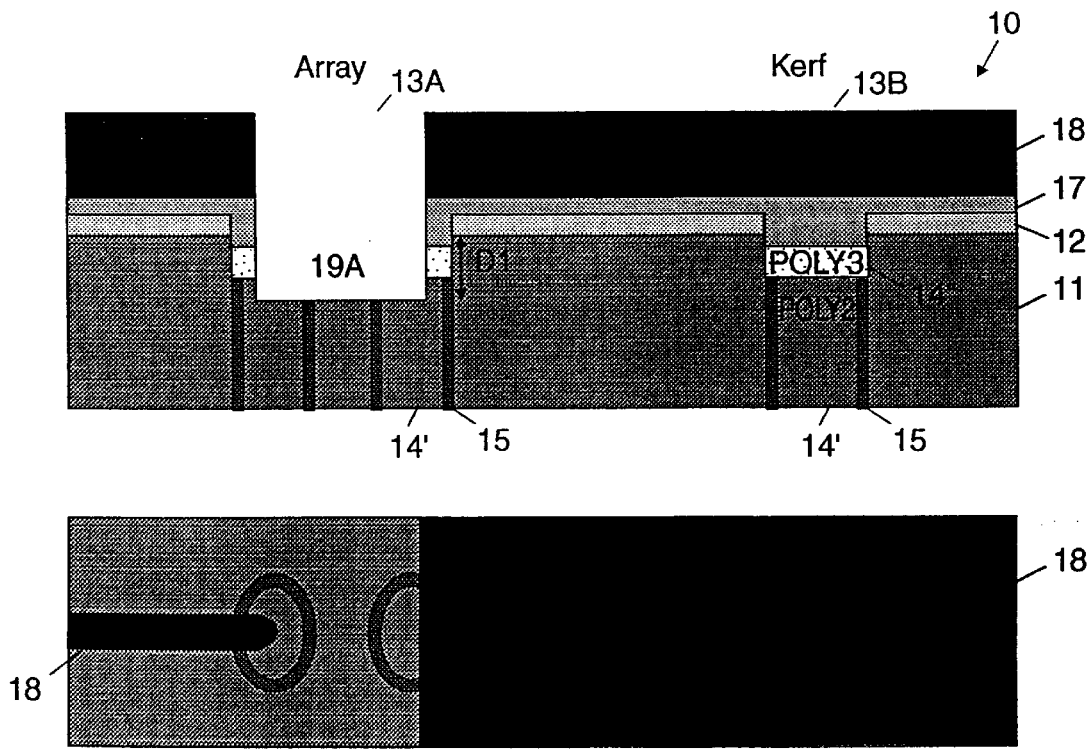
Figure 2D:
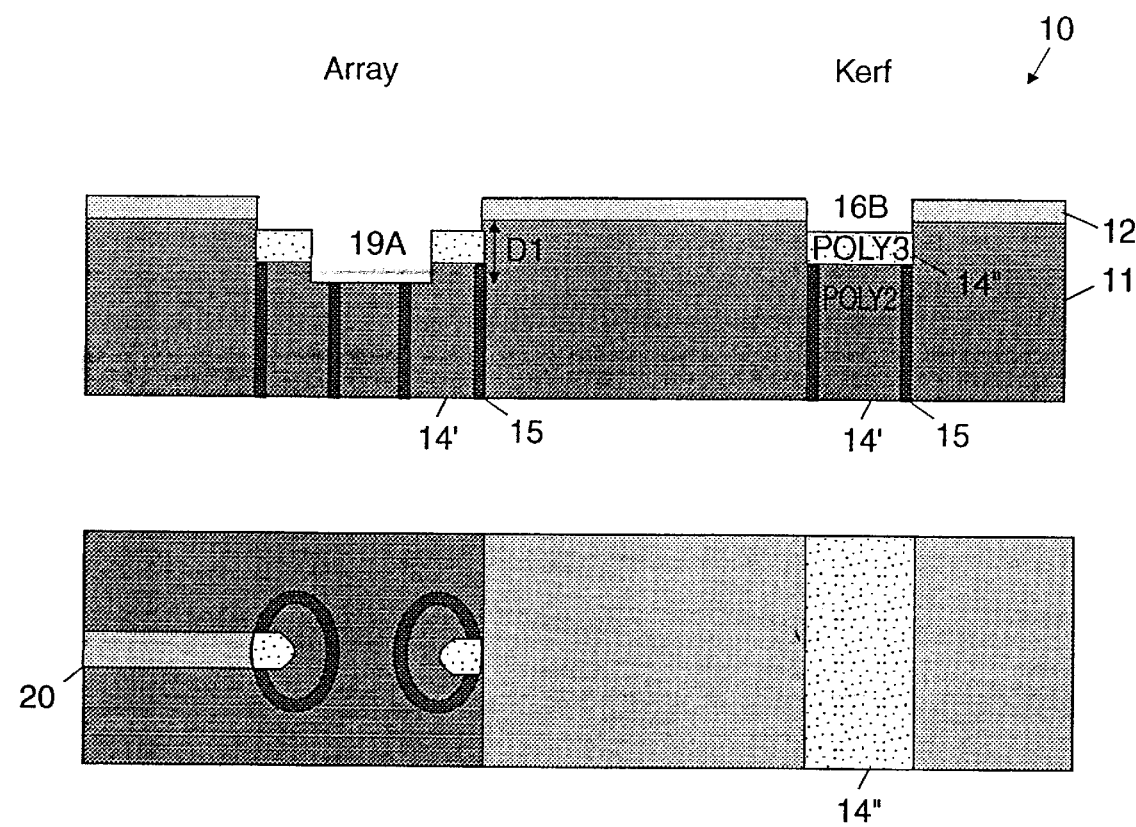
Figure 2E:
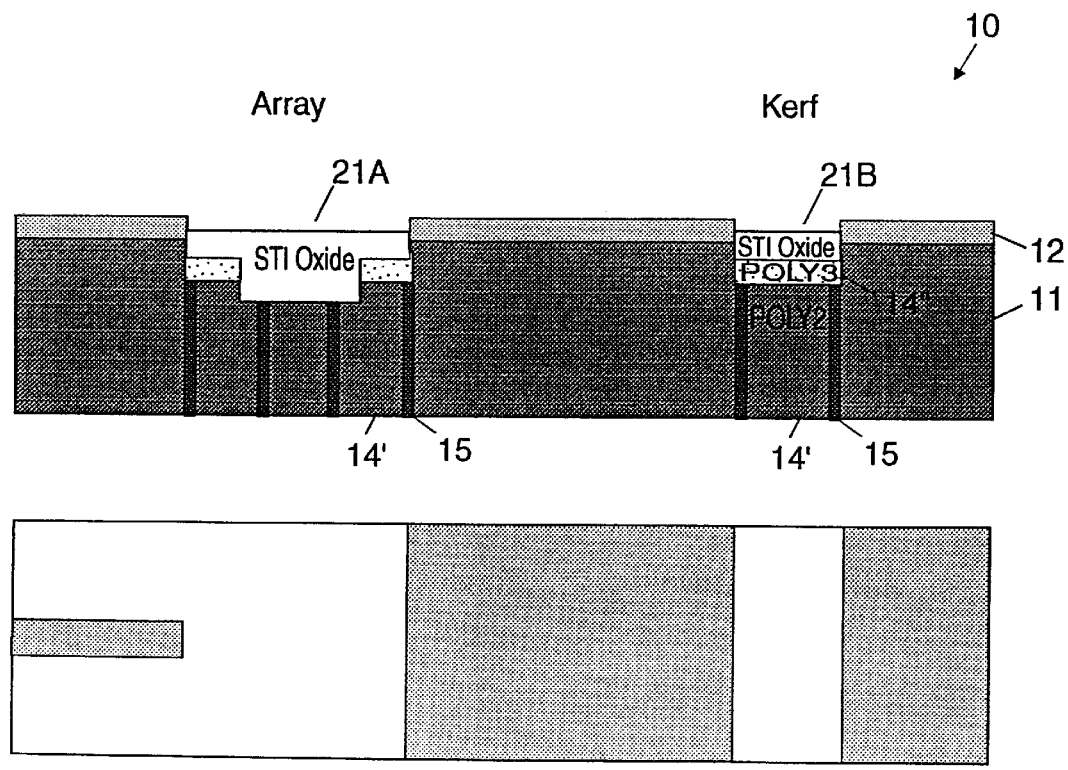
Figure 2F:
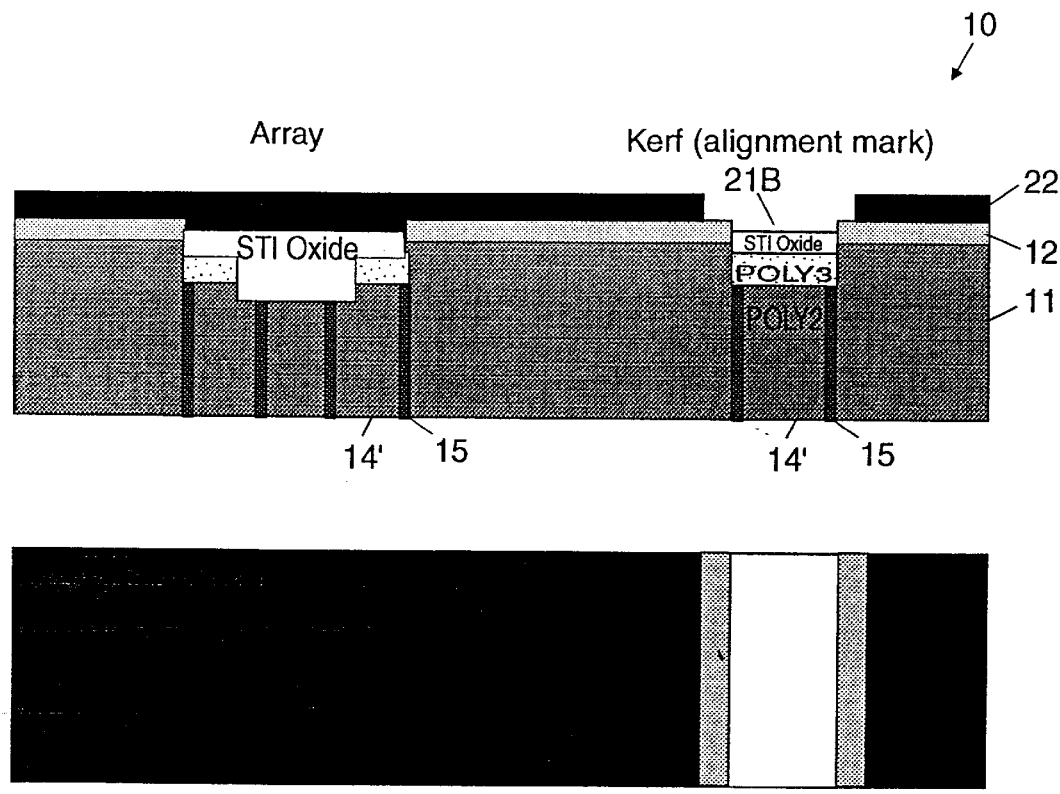
Figure 2G:
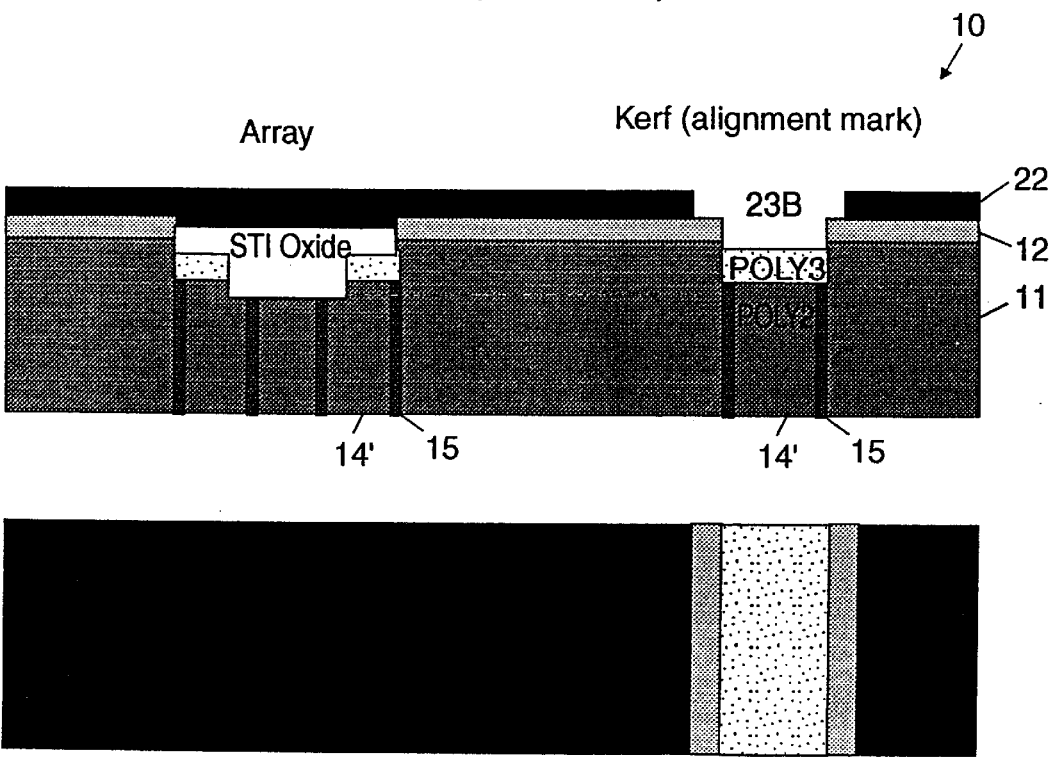
Figure 2H:
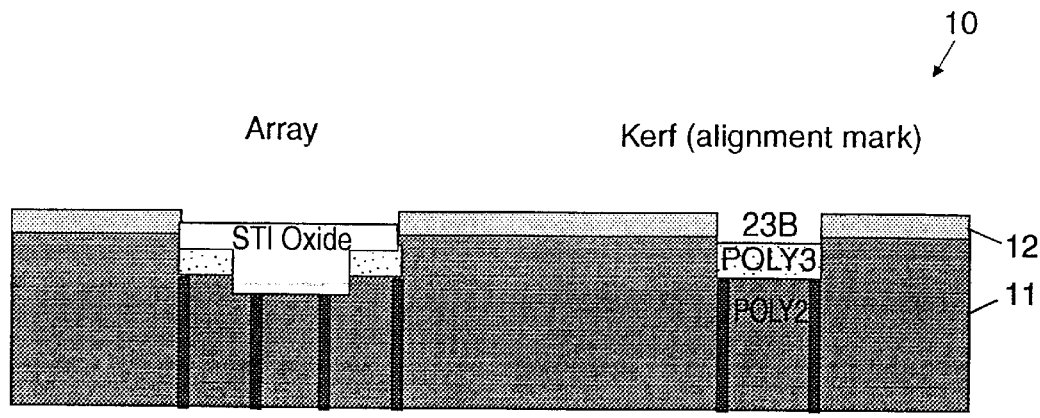
Figure 2H:
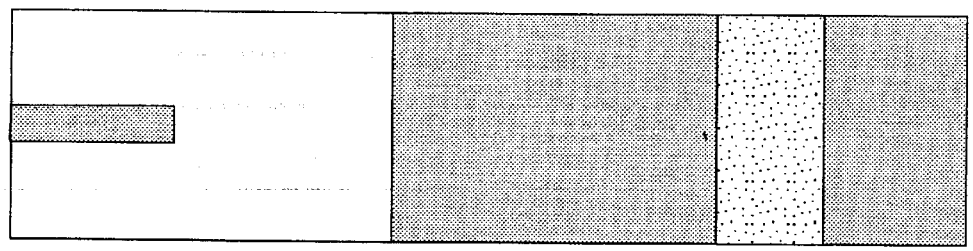
Figure 2I:
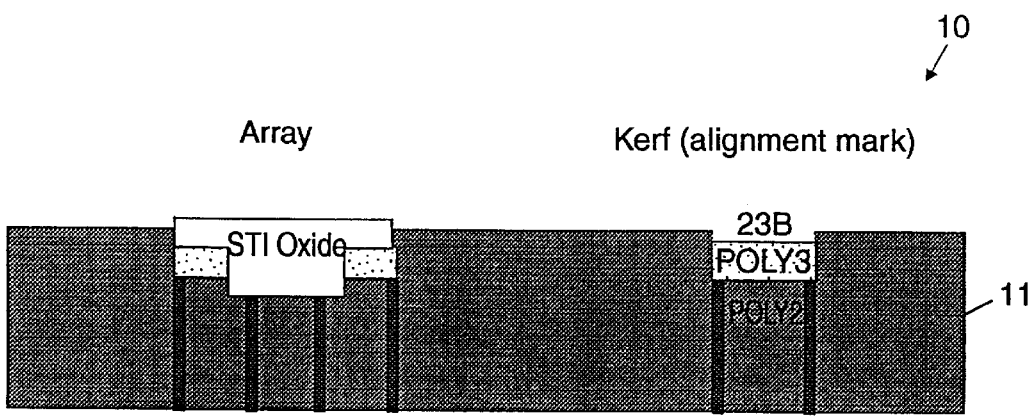
Figure 2I:
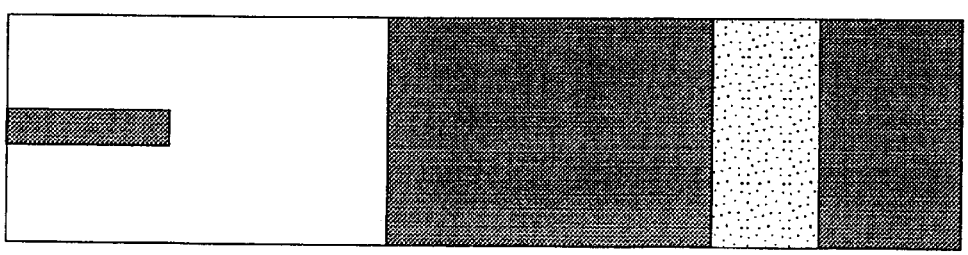

Applicant's inventors have discovered that the process flow of the prior art method described above by reference to FIGS. 2A–2I could be significantly improved. The novel method of forming the STI oxide regions and alignment marks in a semiconductor structure with only one masking step (instead of two) will be now described by reference to FIGS. 3A–3H. With regards to FIGS. 2A–2I, like reference numerals (with prime) are used through the several drawings to designate identical (corresponding) parts. The starting structure is still structure 10 shown in FIG. 1. It is important to point out that the illustrations are not necessarily drawn to scale. Basically, the essential point of the improved method consists in changes in the AA/STI step which now includes the RECESS3 etch.

Figure 3A:
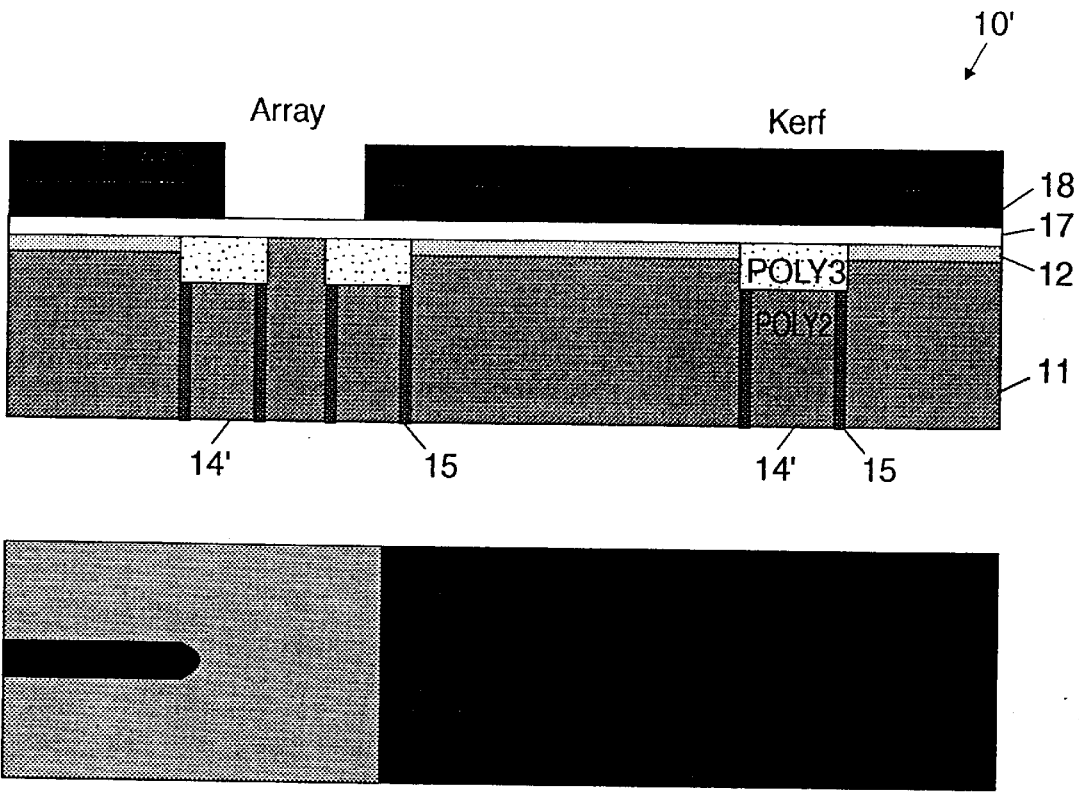
FIGS. 3A–3H show the structure of FIG. 1 undergoing the sequence of steps to simultaneously form the STI oxide regions and alignment marks without requiring the KV mask according to the method of the present invention.

First of all, according to the present invention, the AA mask is formed onto structure 10 before etching the POLY3 down to RECESS3 depth. As a consequence, it is now formed onto a planar surface which ensures a better definition of the AAs. The AA mask is formed as described above in conjunction with FIG. 2B. At this initial stage of the improved fabrication process, the structure 10 (now referenced 10' for the sake of convenience) is shown in FIG. 3A where the patterned ARC and photoresist layers are still referenced 17 and 18 respectively.

Figure 3B:
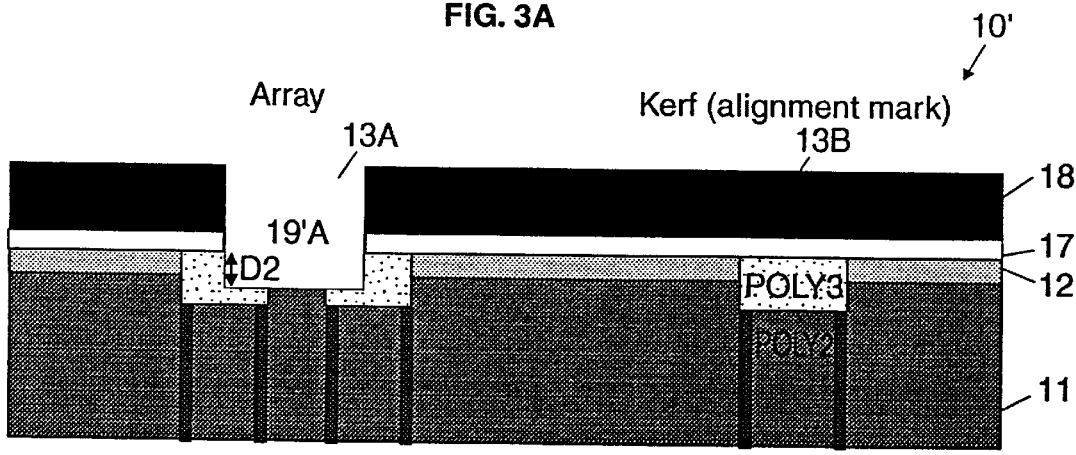
Figure 3B:

Then, the three-step anisotropic dry etch process described above by reference to FIG. 2C is performed with the same equipment and substantially the same operating conditions to etch the ARC, Si3N4, monocrystalline silicon and the polysilicon of POLY3 to create a recess bearing numeral 19'A in FIG. 3B. The major difference is that the etching of the shallow isolation trenches is not made to final STI oxide region depth D1 but to a lesser depth D2. This is an essential feature of the method of the present invention. As a consequence, the duration of step 3 is shortened to 75 sec (instead of 260 sec). The etching of POLY3 is stopped at a depth given by the relation D2=D1−(Si3N4 pad layer thickness+RECESS3 depth). Typically, D2 is equal to about 70 nm.

Now, the photoresist and the ARC materials are partially stripped by ashing from the wafer surface, i.e. they are removed only in the "array" areas. The photoresist/ARC patterns are etched by the top and by their side, so that due to their small dimensions in the "array" areas (less than 250 nm), they are readily eliminated, while they substantially remain unattacked in the "kerf" areas. It is another essential feature of the method of the present invention. This step is achieved by the same conventional photoresist strip process as described above but with a much shorter etch time, a lower temperature (less than 150° C. to avoid photoresist reflow) and a lower oxygen flow. As a result, about 150 nm of the photoresist layer 18 are removed in the "kerf" areas. This step is carried out in a Fusion Gemini MCU, a tool manufactured by Eaton Corp, Beverly, Mass., USA.

Process parameters for this stripping step read as follows:

| | |
|---|---|
| O2 flow | 2 slm |
| N2 flow | 0.35 slm |
| Temp. | 140° C. |
| Power | 150 W |
| Pressure | 1.5 Torr |
| Duration | 30 sec |

Figure 3C:
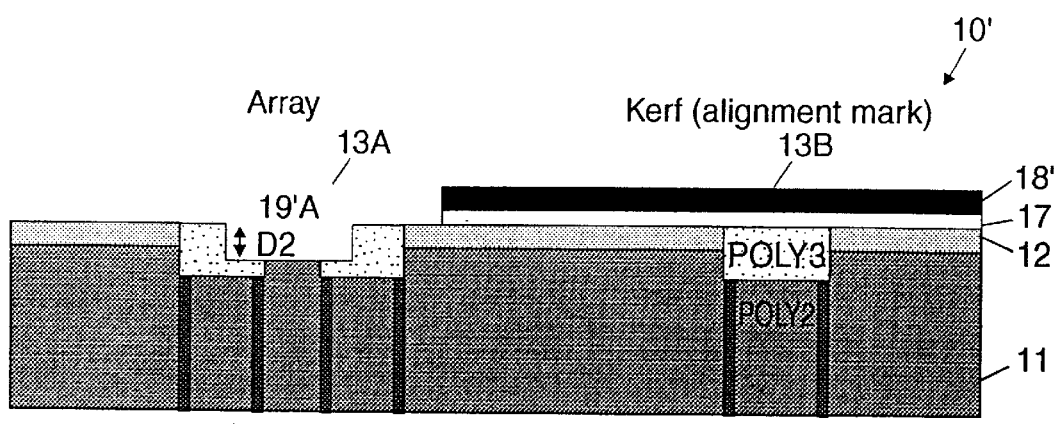

At this stage of the fabrication process, the resulting structure 10' is shown in FIG. 3C. As apparent in FIG. 3C, the ARC and photoresist materials of layers 17 and 18 have been totally eliminated from the "array" areas (because the minute dimensions of the photoresist/ARC patterns in these zones as explained above) and has become thinner above the "kerf" areas. The photoresist layer which remains only on the "kerf" areas is referenced 18' in FIG. 3C, to take into account that its thickness has been reduced in some extent. It is important to notice that photoresist layer 18' must have a sufficient thickness to protect the underlying layers during the subsequent etch steps. Accordingly, the above photoresist strip process described by reference to FIG. 3C must be well controlled.

Next, land-shaped AAs 20 are terminated according to an additional anisotropic dry etch step which is based upon a selective chemistry. This chemistry etches the polysilicon of POLY3 and POLY2, the monocrystalline silicon and the collar oxide at substantially the same etch rate, selectively to Si3N4 and photoresist materials, down to final STI oxide regions depth Dl below silicon substrate 11 surface. This step is conducted in a LAM 9400 provided with a TCP chamber, a tool manufactured by LAM Research, Freemont, Calif., USA.

Process parameters for this etch step read as follows:

| He Backside pressure | 8 Torr |
|---|---|
| Bottom electrode temp | 50° C. |
| Pressure | 6 mTorr |
| TCP power | 135 W |
| Bias power | 55 W |
| HBr flow | 250 sccm |
| HeO2 flow | 9 sccm |

Figure 3D:
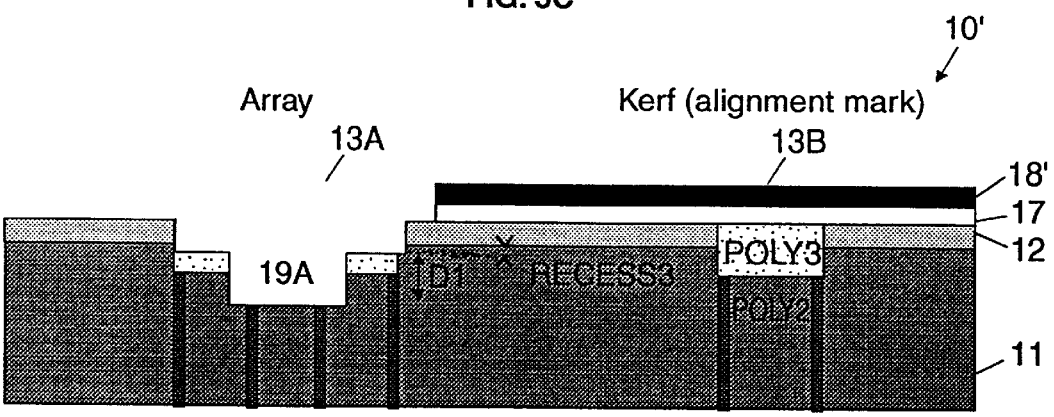
Figure 3D:
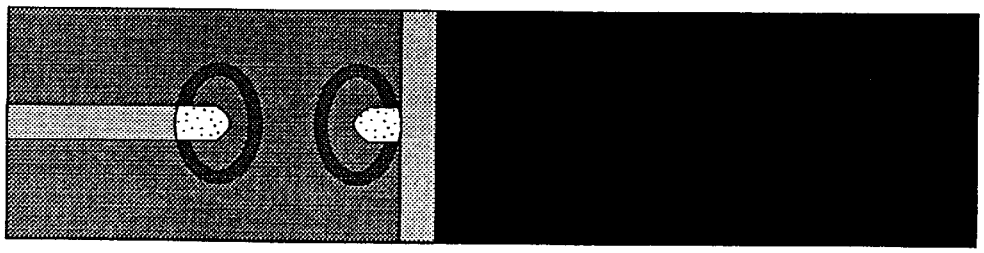

At this stage of the fabrication process, the structure 10' is shown in FIG. 3D. Turning to FIG. 3D, the recess in deep trench 13A is referenced 19A because there is no difference with the corresponding recess shown in FIG. 2C.

Figure 3E:
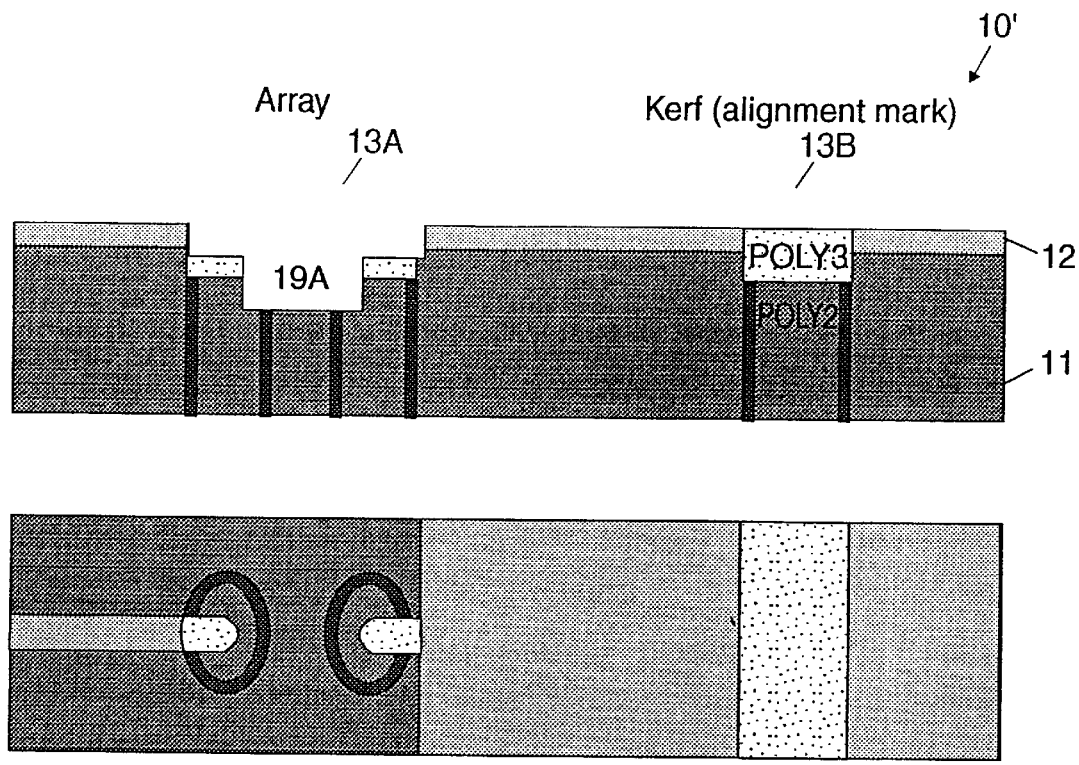

The ARC and the photoresist materials of layers 17 and 18' are then totally removed as standard as illustrated in FIG. 3E.

The main difference with the conventional fabrication process lies in the fact that with the improved method, the deep trenches 13B to be subsequently used as alignment marks are not filled with STI oxide at this stage of the fabrication process but with polysilicon (POLY3). As apparent in FIG. 3E, the polysilicon of POLY3 in deep trench 13B is coplanar with the Si3N4 pad layer 12 because no recess has been made therein as of yet. This is another essential feature of the improved method of the present invention.

Figure 3F:
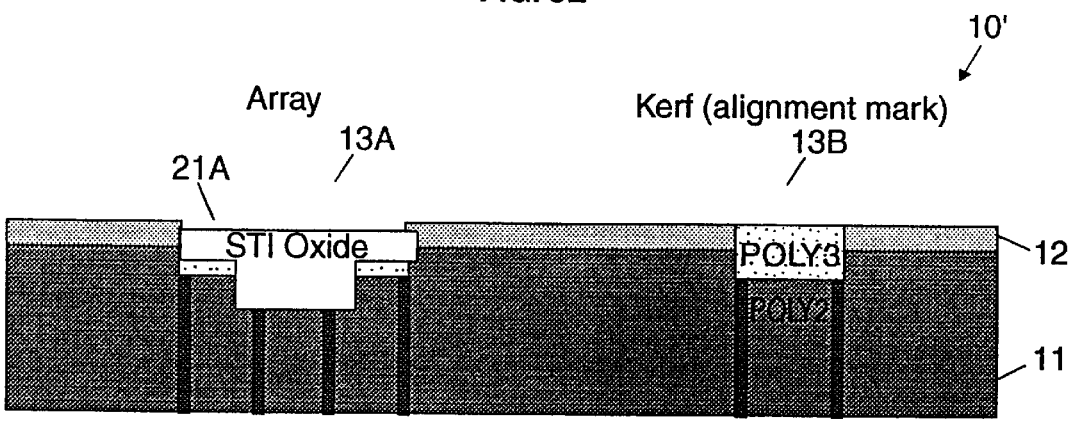
Figure 3F:
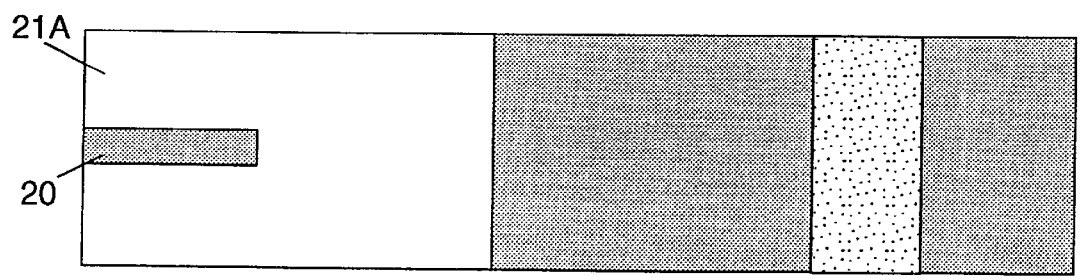

Next, the sequence of STI oxide filling/CMP planarizing steps described above by reference to FIG. 2E is the same. The shallow isolation trenches 19A in deep trenches 13A are conformally filled with STI oxide and then, the structure 10' is planarized by CMP to form STI oxide regions. The resulting structure is illustrated in FIG. 3F. As apparent in FIG. 3F, STI oxide regions still referenced 21A and POLY3 regions in deep trenches 13B are exposed at this stage of the fabrication process.

Now, the alignment marks are created in the "kerf" areas. If recesses are desired (after Si3N4 layer 12 elimination), the POLY3 material is partially or totally removed by etching, on the contrary, if bumps are preferred, it is not attacked. The improved method of the present invention thus offers a great flexibility in that respect.

Typically, about 60 nm of polysilicon of POLY3 in deep trenches 13B are removed selectively to Si3N4 and STI oxide.

If wet etching is preferred, this step can be conducted in a CFM wet bench, a tool manufactured by CFM Technologies Inc, West Chester, Pa., USA with process parameters given below.

| KOH flow | 3 gal./min (recirculated) |
|---|---|
| Temp. | 45° C. |

Rinse and dry as standard

If dry etching is preferred, this step can be carried out in the DPS chamber of an AME 5200, a tool sold by Applied Materials Inc, Santa Clara, Calif., USA, using the following operating conditions:

Step 1: Native Oxide Elimination

| CF4 flow | 50 sccm |
|---|---|
| Pressure | 5 mTorr |
| Bias power | 20 Watt |
| Source power | 500 Watt |
| He cooling | 7 Torr |
| Time | 5 sec |

Step 2: Polysilicon Etch

| SF6 flow | 60 sccm |
|---|---|
| Pressure | 5 mTorr |
| Bias power | 0 Watt |
| Source power | 150 Watt |
| He cooling | 7 Torr |
| Time | 20 sec |

Figure 3G:
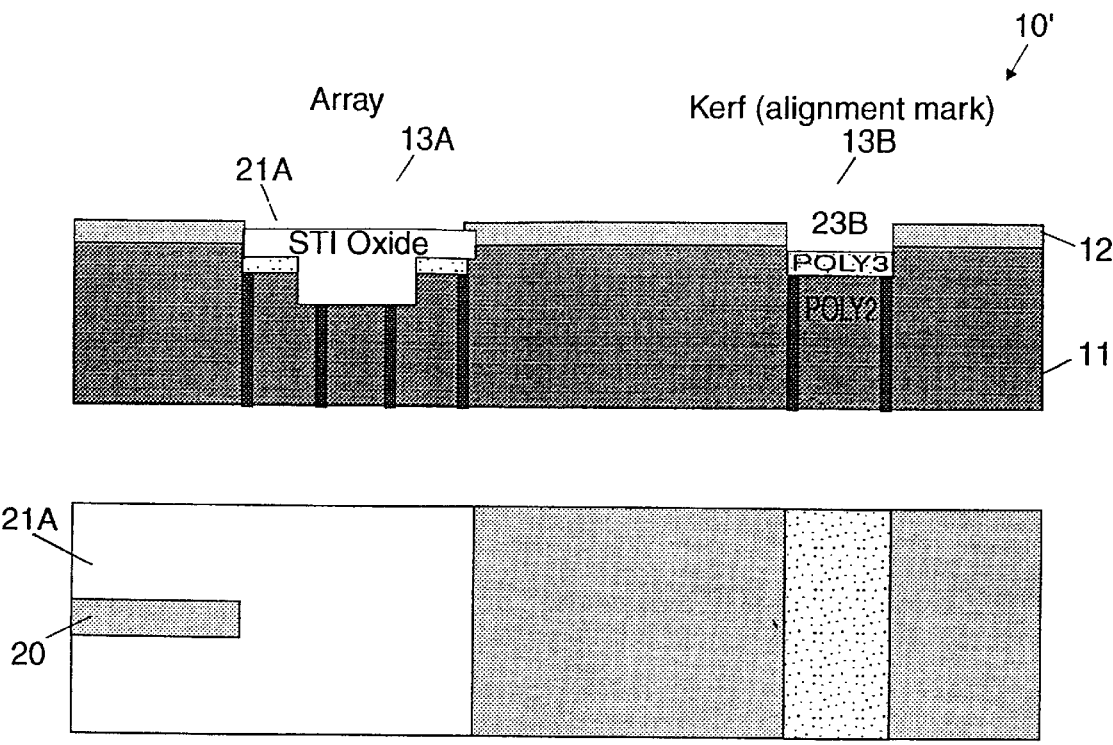

At this stage of the fabrication process, the structure is shown in FIG. 3G.

Figure 3H:
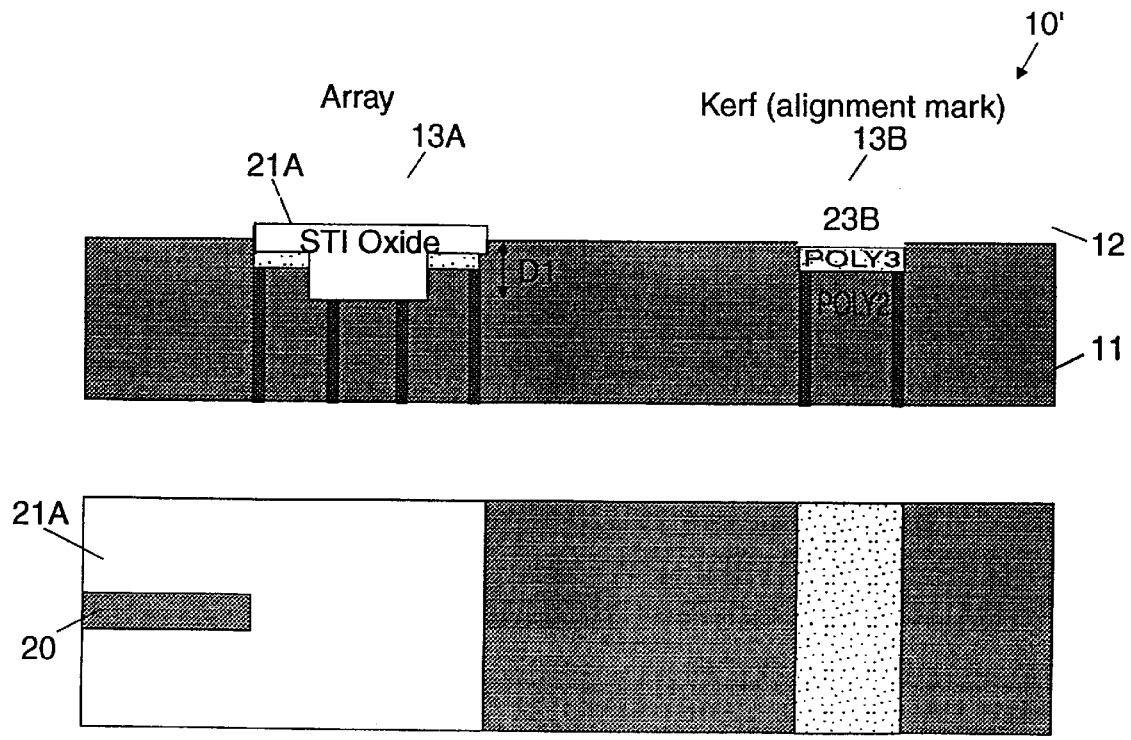

Finally, the Si3N4 layer 12 is removed as standard leaving the structure illustrated in FIG. 3H. In FIG. 3H, the recesses to produce the desired alignment marks are still referenced 23B because they are identical to the corresponding recesses depicted in FIG. 2I.

While the invention has been particularly described with respect to a preferred embodiment thereof it should be understood by one skilled in the art that the foregoing and other changes in form and details may be made therein without departing from the spirit and scope of the invention.

What is claimed is:

1. A method of forming STI oxide regions and alignment marks in a semiconductor substrate, comprising the steps of:

a) patterning a layer of photoresist on the surface of a semiconductor substrate, said substrate having an array area and a kerf area, said array area having trenches of a first type, said kerf area having trenches of a second type, said first and second type trenches filled with an insulator material, at least one of each of said first and second trenches insulator material comprising at least two parts, the first part comprising a first insulating material and a second part comprising a second insulating material, said second part isolated from the substrate, and wherein the patterning exposes at least a portion of at least one of the trenches in the array area and the patterning does not expose at least one trench in the kerf area;

b) etching the substrate with a first etch such that less than substantially all of the first insulating material exposed by the patterning is removed, the continuing until a recess of a predetermined depth, D2, is formed;

c) stripping the photoresist from substantially all of at least one of the trenches in the array area etched in step b;

d) etching the structure with a second etch such that at least a portion of the substrate not exposed in step b is etched, said etching extending said recess to a second depth, D1, where D1>D2;

e) stripping substantially all of the photoresist from the surface of the substrate;

f) depositing a layer of oxide; and g) planarizing the layer of oxide such that the first material in the kerf area is exposed.

2. The method of claim 1 wherein the surface of the substrate has a barrier layer thereon prior to the step of patterning, the barrier layer having a depth, D3.

3. The method of claim 2 further comprising the step of
   h) etching the first material in the kerf area to form a recess, R1, wherein the recess extends substantially through the barrier layer and into at least a portion of the substrate after step g.

4. The method of claim 2 wherein the planarizing is terminated prior to exposing the surface of the substrate.

5. The method of claim 3 wherein the planarizing is terminated prior to exposing the surface of the substrate.

6. The method of claim 5 wherein recess, R1, is defined by R1=D1−D2−D3.

7. The method of claim 1 wherein the first and second insulating materials are polysilicon and the isolation comprises oxide collars.

8. The method of claim 6 wherein the barrier layer comprises silicon nitride.

9. The method of claim 5 wherein the barrier layer is removed after the etching in step h.

10. The method of claim 9 wherein the etching in step h comprises wet etching.

11. The method of claim 1 wherein said first and second insulating materials comprise different insulating materials.

* * * * *